United States Patent
Kocon et al.

(10) Patent No.: US 8,288,820 B2
(45) Date of Patent: Oct. 16, 2012

(54) HIGH VOLTAGE POWER INTEGRATED CIRCUIT

(75) Inventors: Christopher Boguslaw Kocon, Mountain Top, PA (US); John Manning Savidge Neilson, Norristown, PA (US); Simon John Molloy, Allentown, PA (US); Haian Lin, Bethlehem, PA (US); Charles Walter Pearce, Emmaus, PA (US)

(73) Assignee: Texas Instruments Incorporated, Dallas, TX (US)

( * ) Notice: Subject to any disclaimer, the term of this patent is extended or adjusted under 35 U.S.C. 154(b) by 166 days.

(21) Appl. No.: 12/815,766

(22) Filed: Jun. 15, 2010

(65) Prior Publication Data

US 2010/0315159 A1    Dec. 16, 2010

Related U.S. Application Data

(60) Provisional application No. 61/187,080, filed on Jun. 15, 2009, provisional application No. 61/187,094, filed on Jun. 15, 2009.

(51) Int. Cl.
*H01L 29/66* (2006.01)
*H01L 21/336* (2006.01)
*H01L 25/00* (2006.01)

(52) U.S. Cl. ............. 257/336; 257/E29.255; 438/286; 327/564

(58) Field of Classification Search .......... 257/336, 257/337, E21.409, E29.255; 438/286, 142, 438/280, 335; 327/564, 565, 566
See application file for complete search history.

(56) References Cited

U.S. PATENT DOCUMENTS

| | | | |
|---|---|---|---|
| 6,476,442 B1 | 11/2002 | Williams et al. | |
| 7,235,845 B2 | 6/2007 | Xu et al. | |
| 7,282,765 B2 | 10/2007 | Xu et al. | |
| 7,868,379 B2 * | 1/2011 | Loechelt | 257/328 |
| 7,923,300 B2 | 4/2011 | Bell et al. | |

* cited by examiner

*Primary Examiner* — A. Sefer
*Assistant Examiner* — Nikolay Yushin
(74) *Attorney, Agent, or Firm* — Jacqueline J. Garner; Wade J. Brady, III; Frederick J. Telecky, Jr.

(57) ABSTRACT

A high performance, power integrated circuit composed of two charge balanced, extended drain NMOS transistors (CB-DEMOS) formed on an n-substrate. A CBDENMOS transistor with an n-type substrate source. A charge balanced channel diode (CBCD) with an n-type substrate. A process for forming a high performance, power integrated circuit composed of two CBDENMOS transistors formed on an n-substrate. A process for forming a power integrated circuit composed of one CBDENMOS transistor and one CBCD on an n-type substrate.

19 Claims, 15 Drawing Sheets

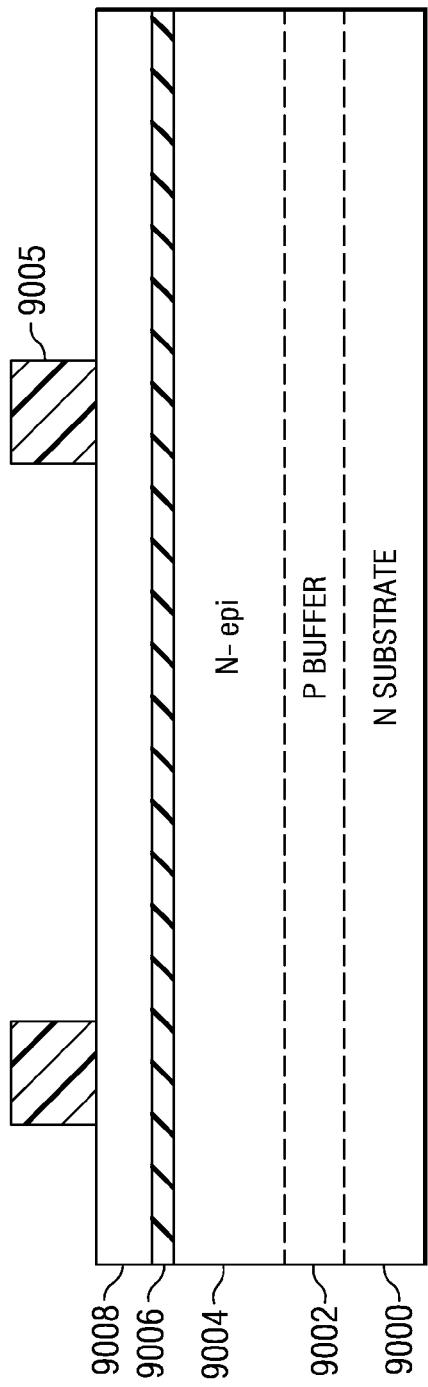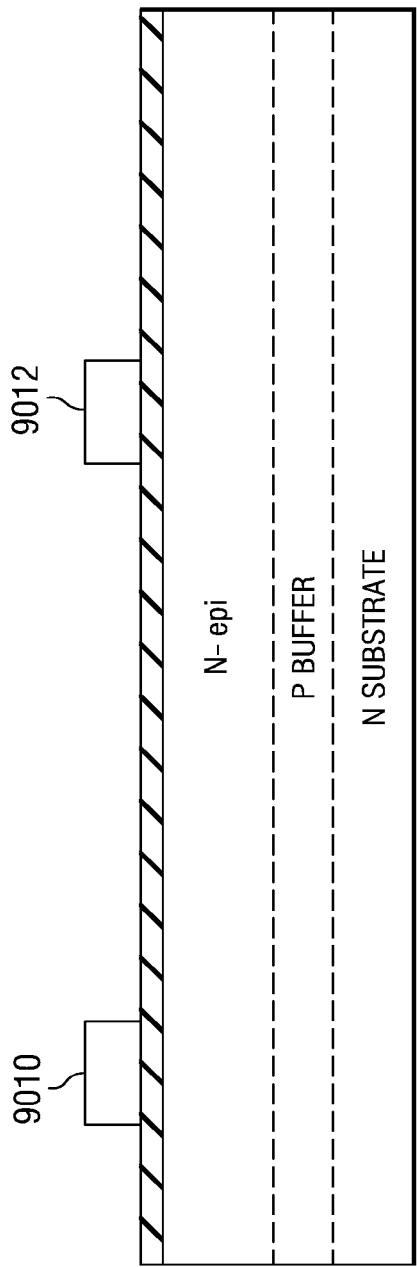
FIG. 9A
FIG. 9B

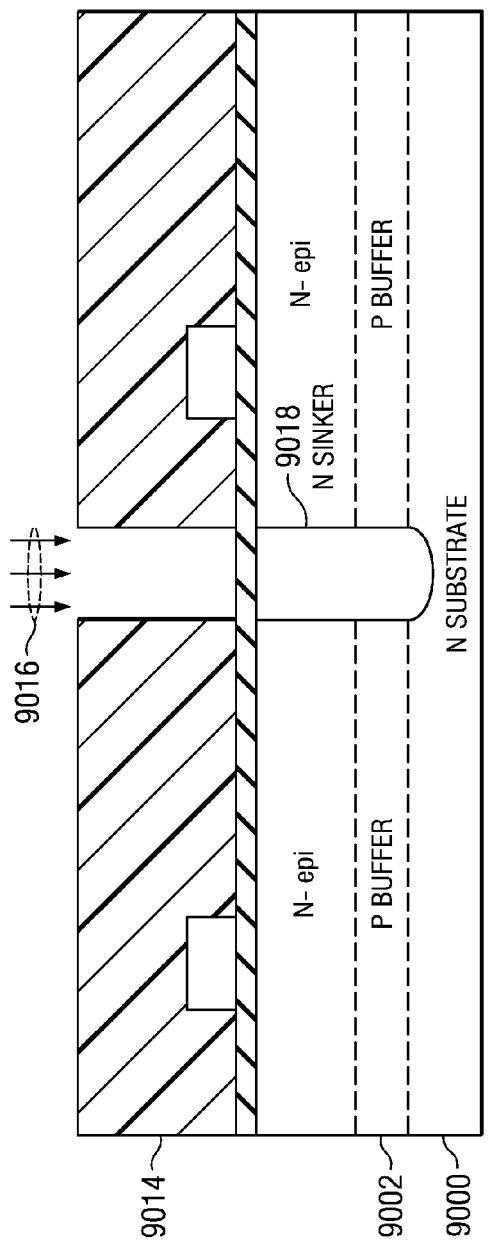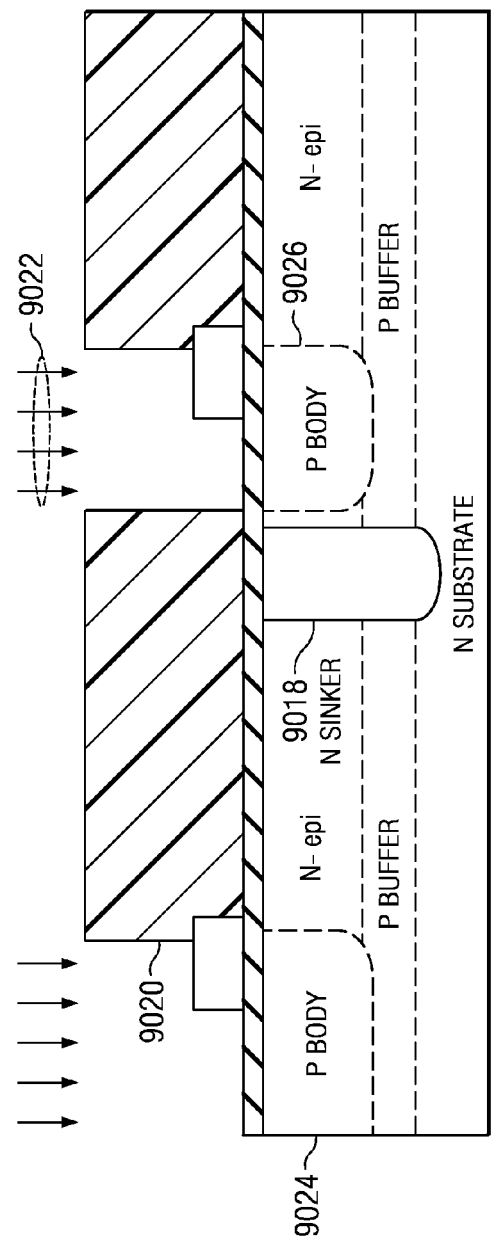

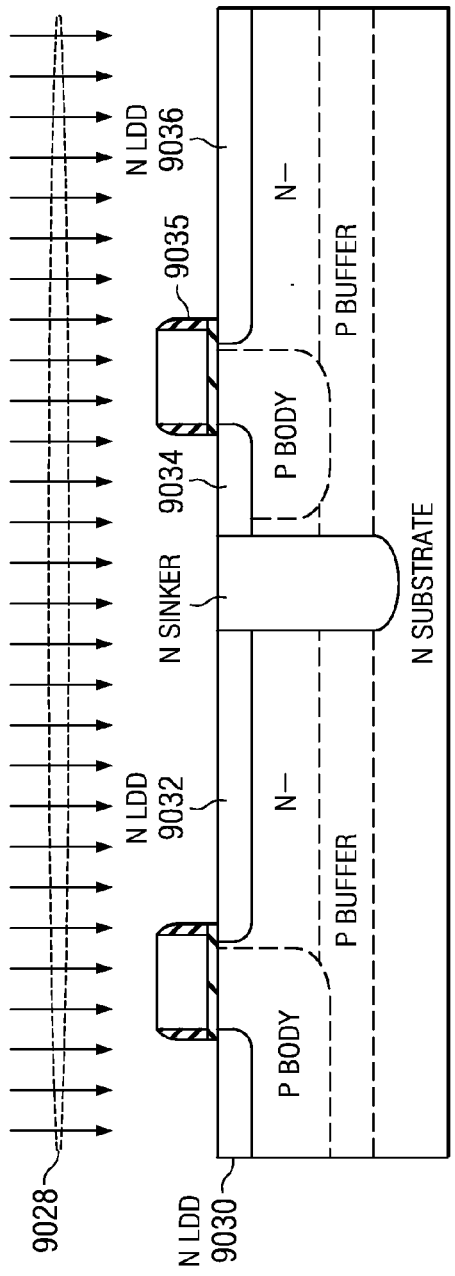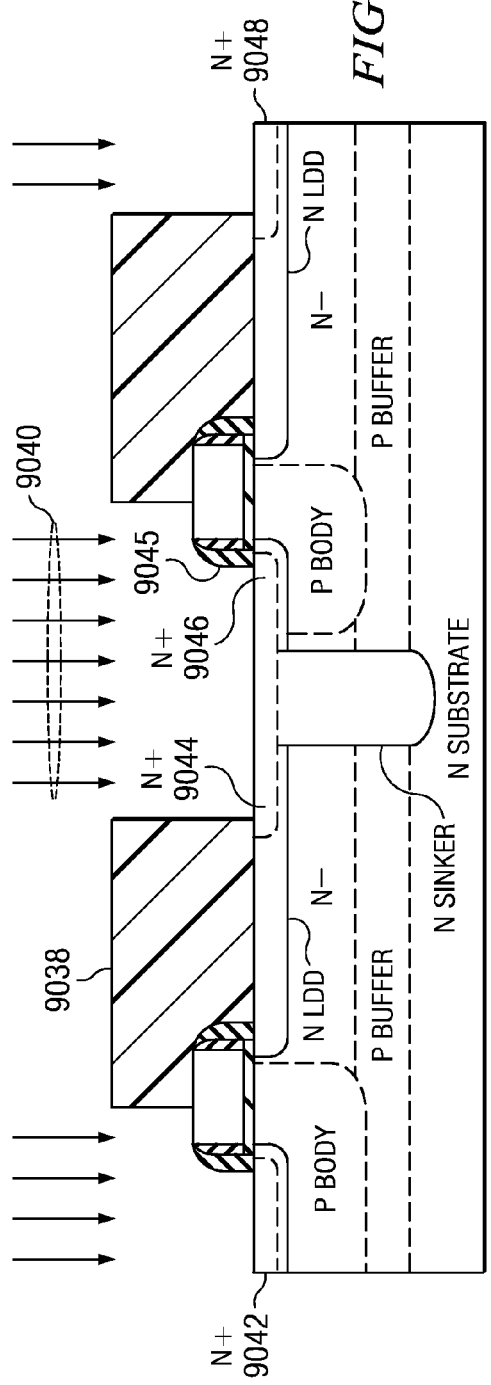

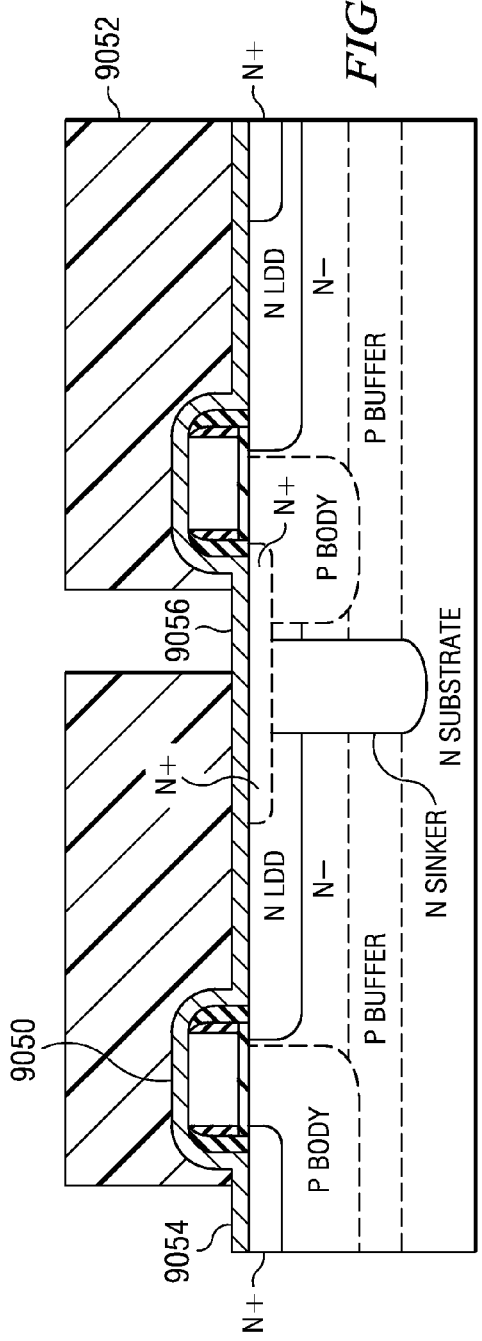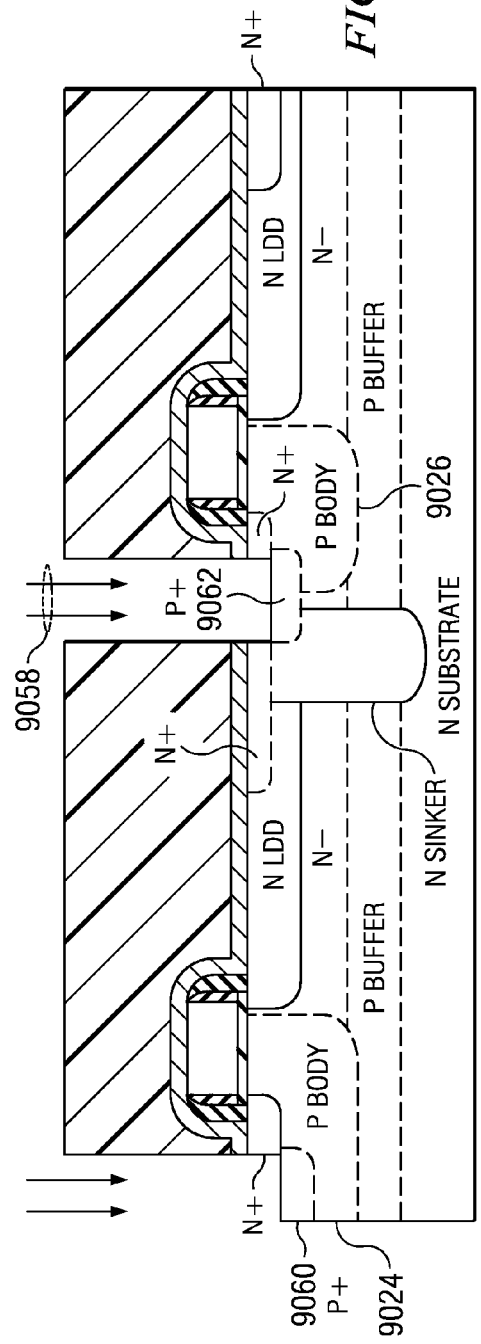

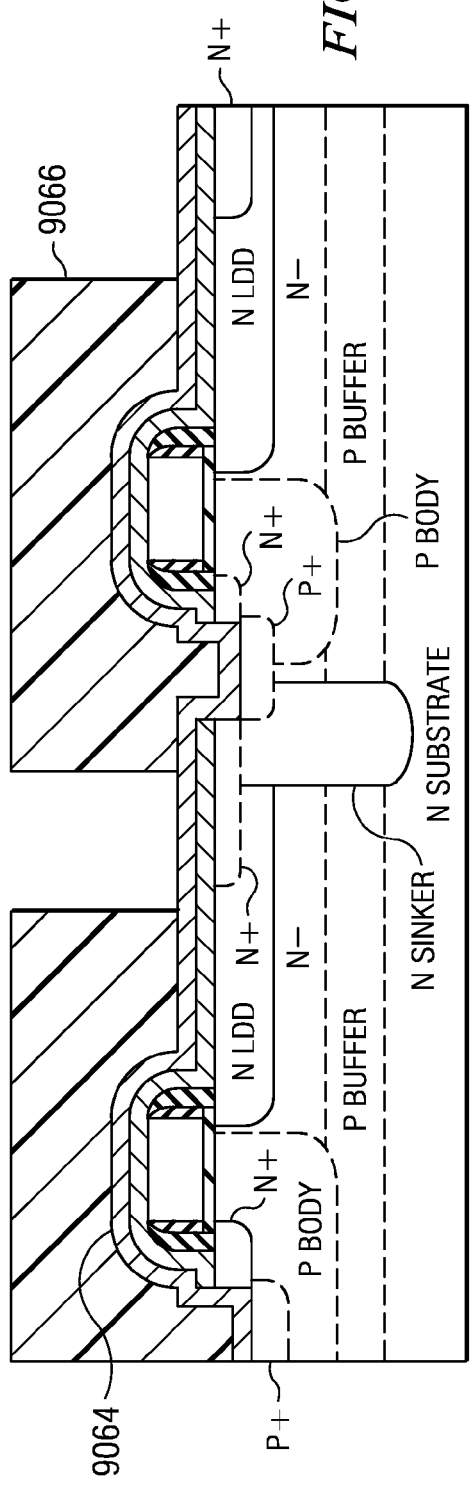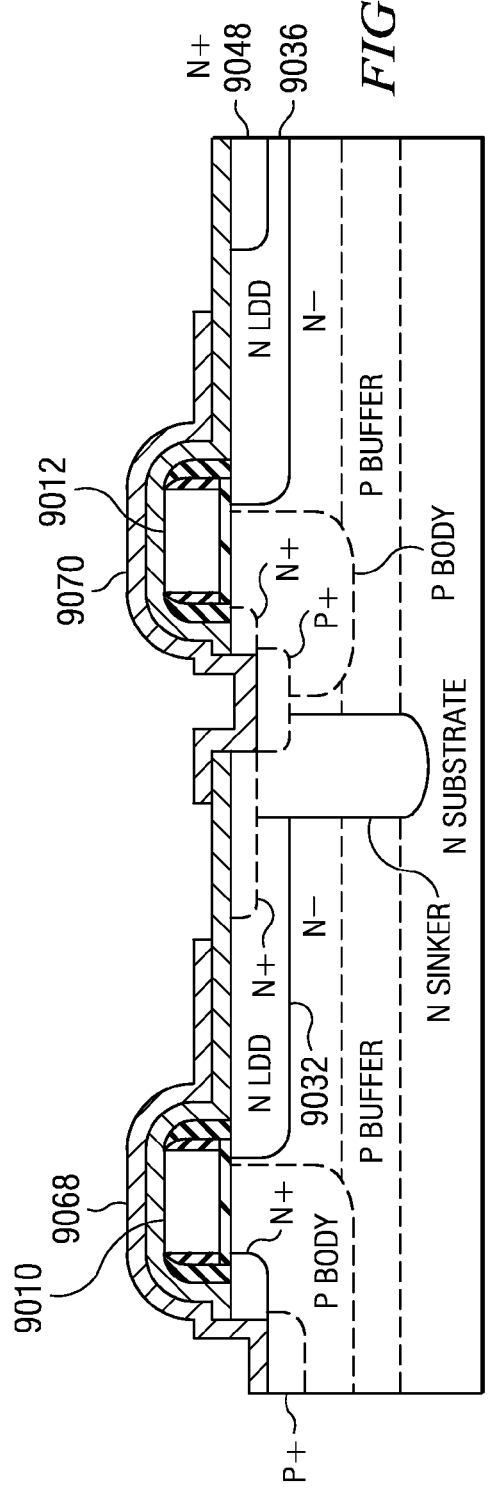

HIGH VOLTAGE POWER INTEGRATED CIRCUIT

CROSS-REFERENCE TO RELATED APPLICATIONS

The following co-pending patent application is related and hereby incorporated by reference: U.S. patent application Ser. No. 12/815,877 filed Jun. 15, 2010.

FIELD OF THE INVENTION

This invention relates to the field of integrated circuits. More particularly, this invention relates to high voltage, high power integrated circuits.

BACKGROUND OF THE INVENTION

It is common for high voltage transistors, high voltage diodes, and high voltage circuits to be formed on same integrated circuit chip as low voltage circuits. They may be used to form buck circuits to step high voltage down to low voltage, boost circuits, to step low voltage up to high voltage, half bridge circuits to rectify AC signals, or for other high voltage logic applications. Frequently they are used for high power applications.

There are two primary methods of adding high voltage capability to an integrated circuit (IC) manufacturing flow. One method is to provide one thickness gate dielectric for core logic and for high voltage transistors to provide a second, thicker gate dielectric and also high voltage transistor patterning and implantation steps. This method adds significant cost to the integrated circuit process flow.

A second method is to form extended drain transistors which avoid the need for two gate dielectric thicknesses. Extended drain transistors (DEMOS) are designed to drop sufficient voltage across an extended drain depletion region so that a core transistor with core gate dielectric may be used to switch the current from a high voltage source.

DEMOS transistors with a charged balanced extended drain are described, e.g. in US 2008-0246086 A1, to Korec, et. al. which is incorporated herein by reference. The charge balanced extended drain enables a reduced area extended drain which reduces manufacturing cost.

Also described in the above mentioned patent publication are NMOS high voltage transistors which use the substrate as one of the transistor nodes. Using the substrate for the current path significantly improves the performance of high power transistors by lowering series resistance, Rsd. For RF applications, NMOS transistors are preferred for speed and are commonly built on p-type substrates. P-type substrates typically are 2 to 3 times more resistive than n-type substrates.

FIG. 1 from the above mentioned patent publication illustrates a high performance, high voltage, charge balanced, drain extended, NMOS power transistor (CBDENMOS) built in an isolated pwell 16 on n-type substrate, 12. The n-type substrate 12 forms the high voltage transistor drain 11 of the CBDENMOS transistor. When a high voltage is placed on the drain, 11, a depletion region forms between the N-substrate, 12, and the p-well 16, between the n-sinker 14 and the p-well 16, and between the NLDD, 20 and the p-well, 16. The drain extension, 20 fully depletes so that sufficient high voltage is dropped between the n-sinker, 14, and the transistor gate 31 to protect the gate dielectric, 36. The gate shield, 28, is shorted to the source 18 and the substrate contact 26. Dielectric layer 34 electrically isolates the gate shield from the gate 31 and the extension region 20. The gate shield 28 overlies the drain extension region, 20, providing a charge balanced condition which enables a higher voltage to be dropped across a shorter length LDD, 20. When the gate 31 is turned on, a channel is formed, and current flows from the drain, 11, through the n-sinker, 14, through the drain extension, 20, through the channel, through the source diffusion, 18 and out the source contact metallization, 29. The n-substrate drain terminal 11 and n-sinker 14 provide a lower resistance path than power transistors with both a topside source and a topside drain. The bottom side substrate drain in CBDENMOS transistor 10 reduces Rsd and enhances the transistor performance especially in high power and high frequency applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one embodiment the invention is a CBDENMOS transistor with an n-type substrate source. In another embodiment the invention is a high performance, power integrated circuit composed of two charge balanced, extended drain NMOS transistors. In another embodiment the invention is a charge balanced channel diode with an n-type substrate source. In another embodiment the inventions is a high performance, power integrated circuit composed of one charge balanced, extended drain NMNOS transistor and one charge balanced channel diode.

DESCRIPTION OF THE VIEWS OF THE DRAWING

FIG. 9A through 9K are illustrations of steps in the fabrication of integrated circuits formed according to embodiments.

DETAILED DESCRIPTION

Figure 1:
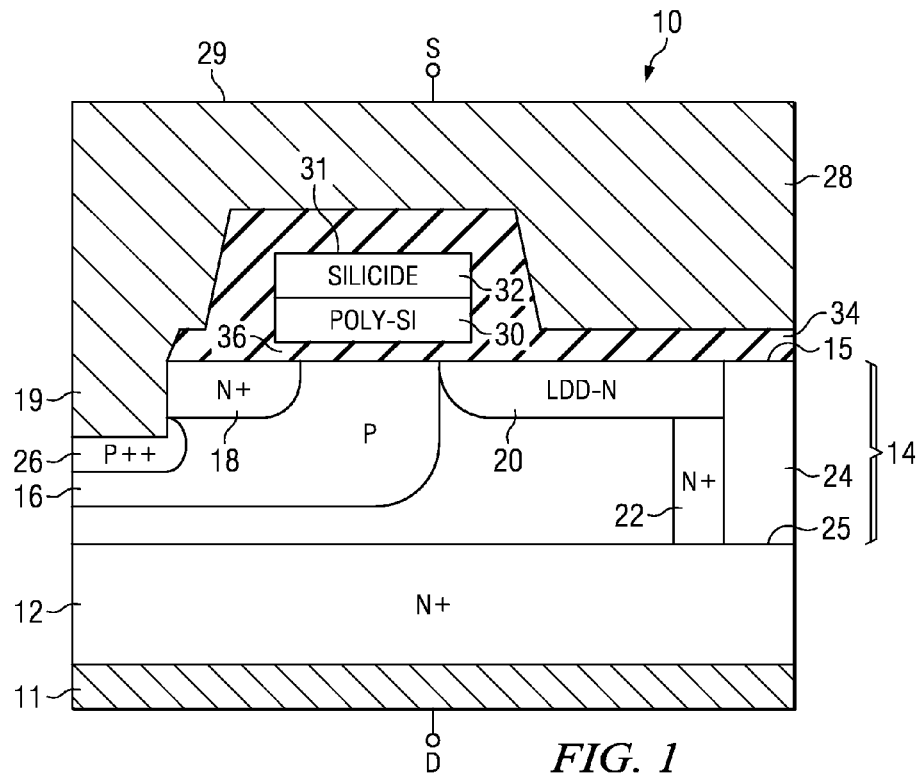
FIG. 1A (Prior Art) DENMOS transistor formed on n-type substrate with the n-type substrate as the drain.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 3:
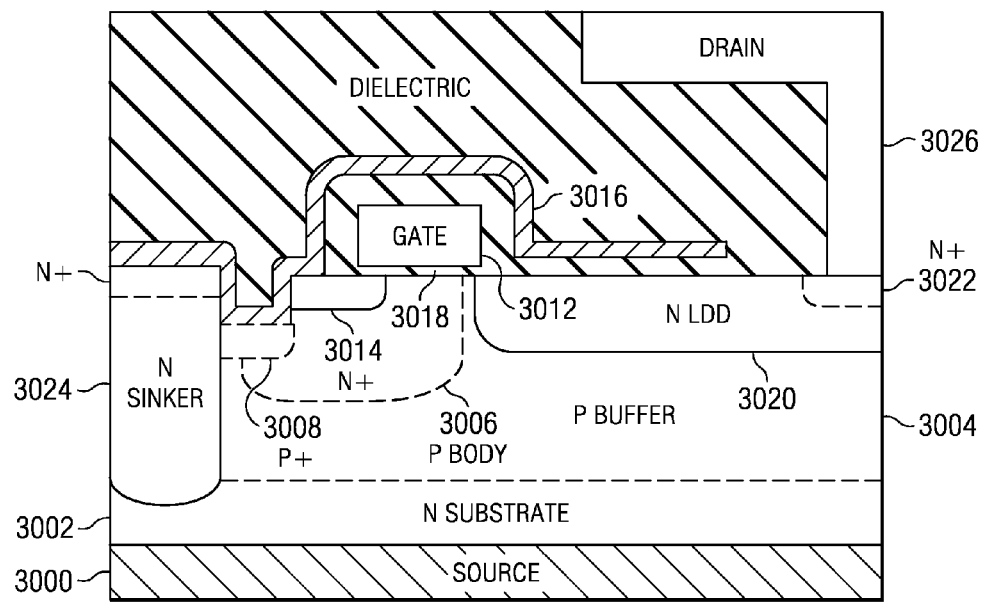
FIG. 3 A DENMOS transistor formed on n-type substrate with the n-type substrate as the source formed according to an embodiment.

An embodiment high voltage, high power, charge balanced, extended drain NMOS transistor (CBEDNMOS) is shown in FIG. 3. An extended drain region, 3020, lies between the gate 3012 and the drain 3022 of this transistor. This extended drain region fully depletes when a high voltage is applied to the drain 3026 dropping sufficient voltage to protect the gate dielectric 3018. Gate shield 3016 is shorted to the transistor source 3014 and substrate contact 3008 and overlies the gate 3012 and also a portion of the extended drain region, 3020 providing a charge balanced condition in the extended drain region which allows a higher voltage to be dropped across a shorter length extended drain 3020, thus saving area and reducing manufacturing cost. A low resistance n-sinker 3024 connects the transistor source diffusion, 3014 to the n-substrate 3002 which is the source contact 3000 for the transistor. The n-sinker and n-substrate provide a low resistance source for the CBEDNMOS transistor.

The CBEDNMOS transistor of FIG. 3 has the advantage over the CBEDNMOS transistor shown in FIG. 1 of reduced capacitance. When a high voltage is applied to the drain 11 in FIG. 1, the n-substrate 12, p-well 16 diode; the n-sinker 14, p-well 16 diode; and the extension 20, p-well 16 diode all charge up whereas when a high voltage is applied to the drain 3026 in FIG. 3, only the extension 3020, p-buffer 3004 diode charges up. This lower capacitance reduces power loss especially for high power applications and improves performance especially for high frequency applications.

Figure 5A:
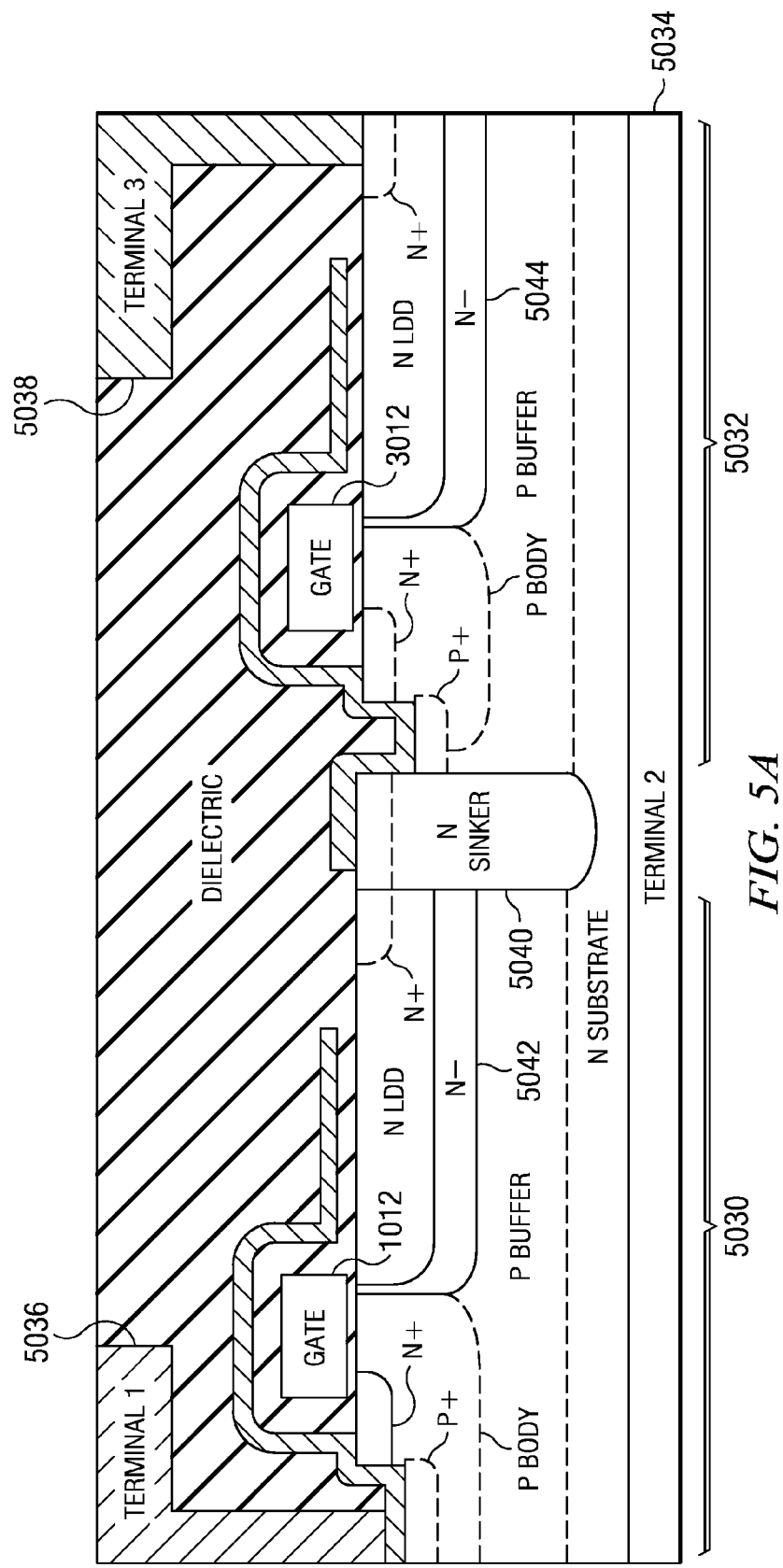
FIGS. 5A through 5D are high performance, power circuits formed using two CBDENMOS transistors according to embodiments.

The embodiment CBEDNMOS transistor in FIG. 3 may be combined with a CBEDNMOS transistor similar to that shown in FIG. 1 to form the very useful embodiment high voltage power circuit shown in FIG. 5A. The CBEDNMOS transistor on the left, 5030, is similar to the transistor described in FIG. 1 and the transistor on the right, 5032 is similar to the transistor described in FIG. 3 except for lightly doped N-layers, 5042 and 5044, which add additional doping gradient to the extended drain region but do not change the basic operation of the CBEDNMOS transistors.

Figure 5B:
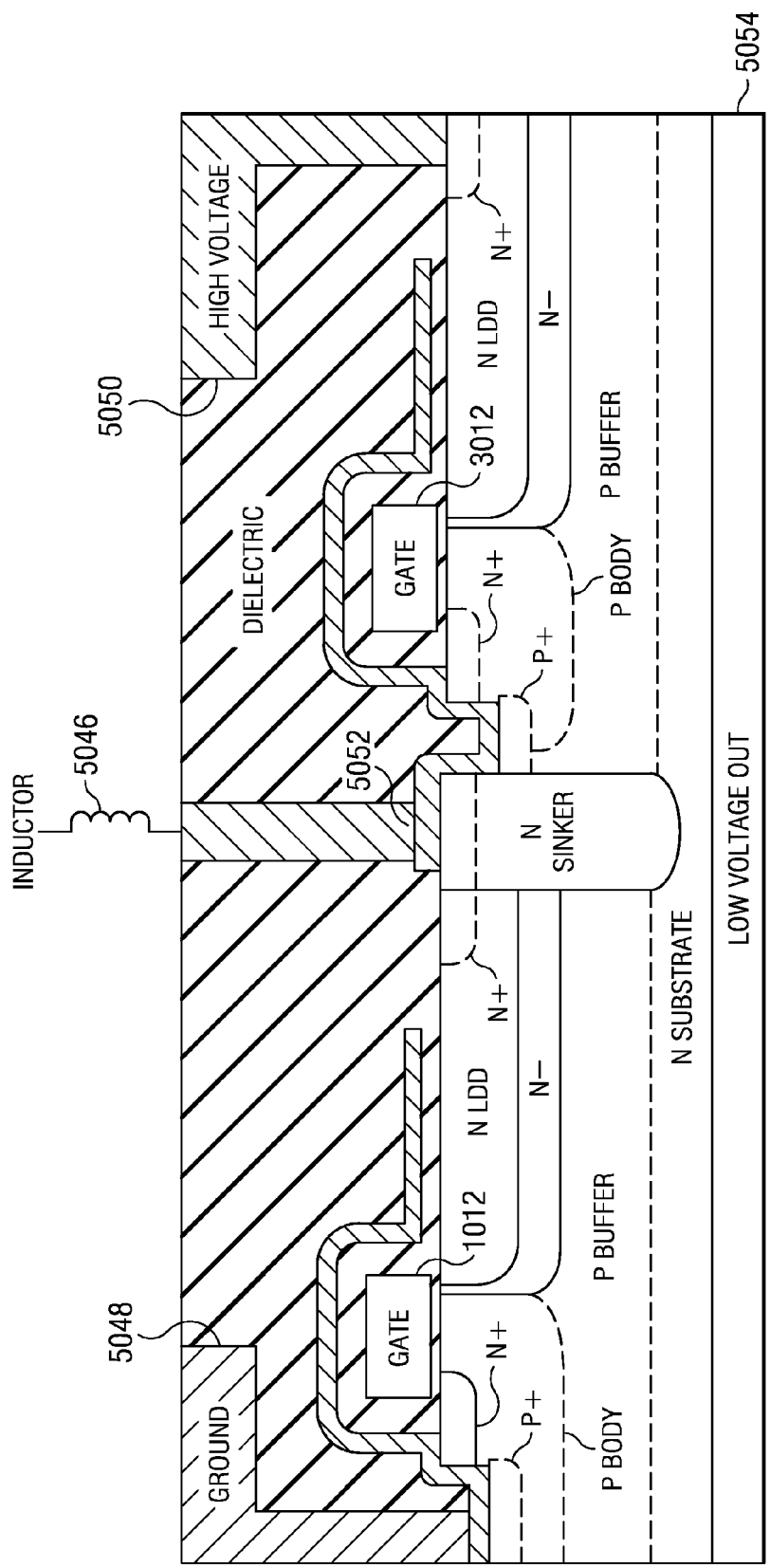

This very flexible circuit may be configured in a number of ways to provide a variety of useful functions. In one example embodiment shown in FIG. 5B this circuit may be configured as a buck circuit. For a buck circuit terminal 3, 5038 becomes a high voltage power supply terminal to which a high voltage 5050 is applied. An inductor 5046 is coupled to common terminal, 5052, and terminal 1 5036 becomes a ground terminal 5048. By applying a signal to turn gates 1012 and 3012 alternately on and off a low voltage DC signal may be formed on terminal 2, 5034. Terminal 2 5034 thus becomes a low voltage output terminal for this configuration. Inductor 5046 shown in schematic form in FIG. 5B, may be formed in the upper interconnect layers of the integrated circuit using well known procedures.

Figure 5C:
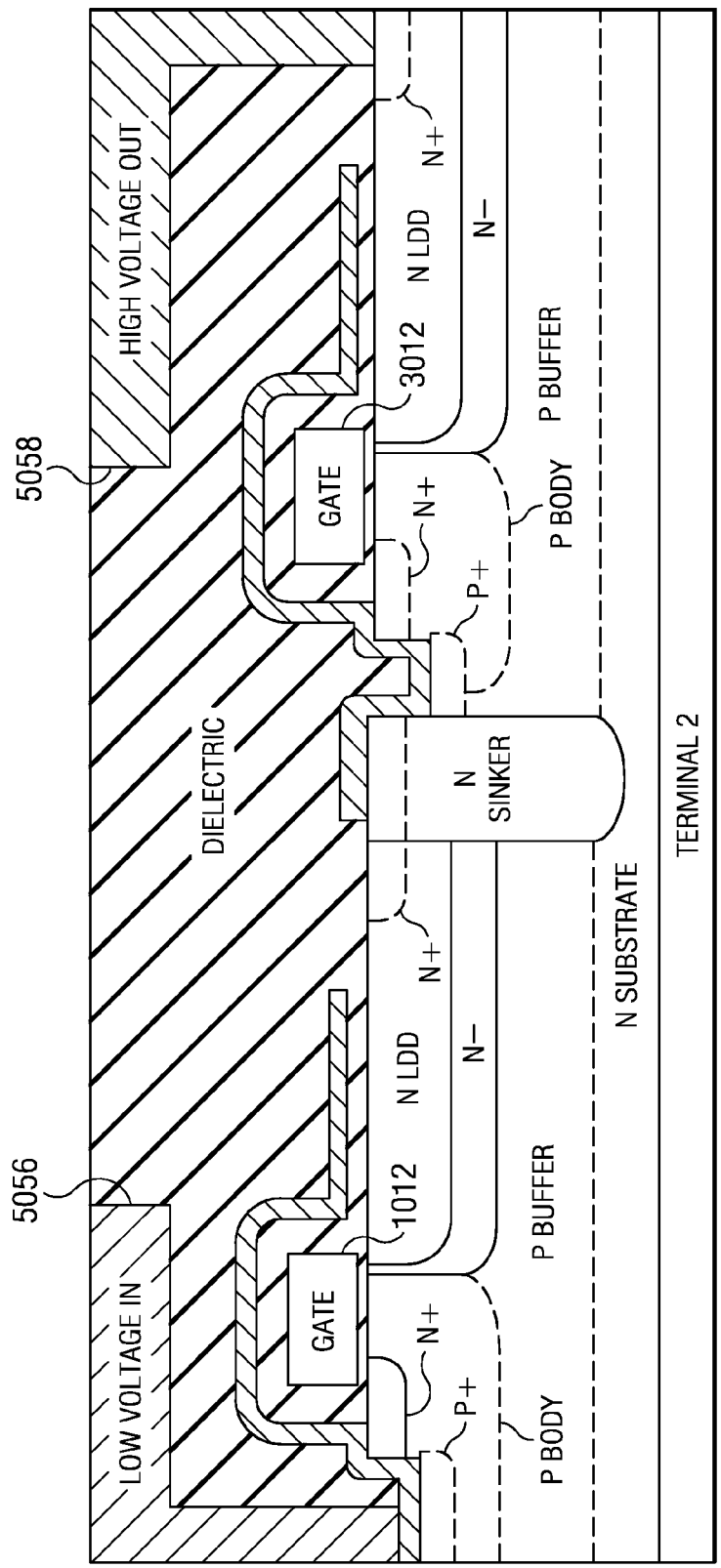

In another example embodiment the circuit in FIG. 5C may be configured as a boost circuit. In this case, terminal 1 5036 becomes a low voltage supply terminal by applying a low voltage 5056 to terminal 1 5036 and then applying a signal to turn gates 1012 and 3012 alternately on an off to pump charge into terminal 2 5034 and into terminal 3 5058 to boost the low input voltage 5056 on terminal 1 5036 to a high output voltage 5058 on terminal 3 5038. Terminal 3 5038 thus becomes a high output voltage 5058 terminal.

Figure 5D:
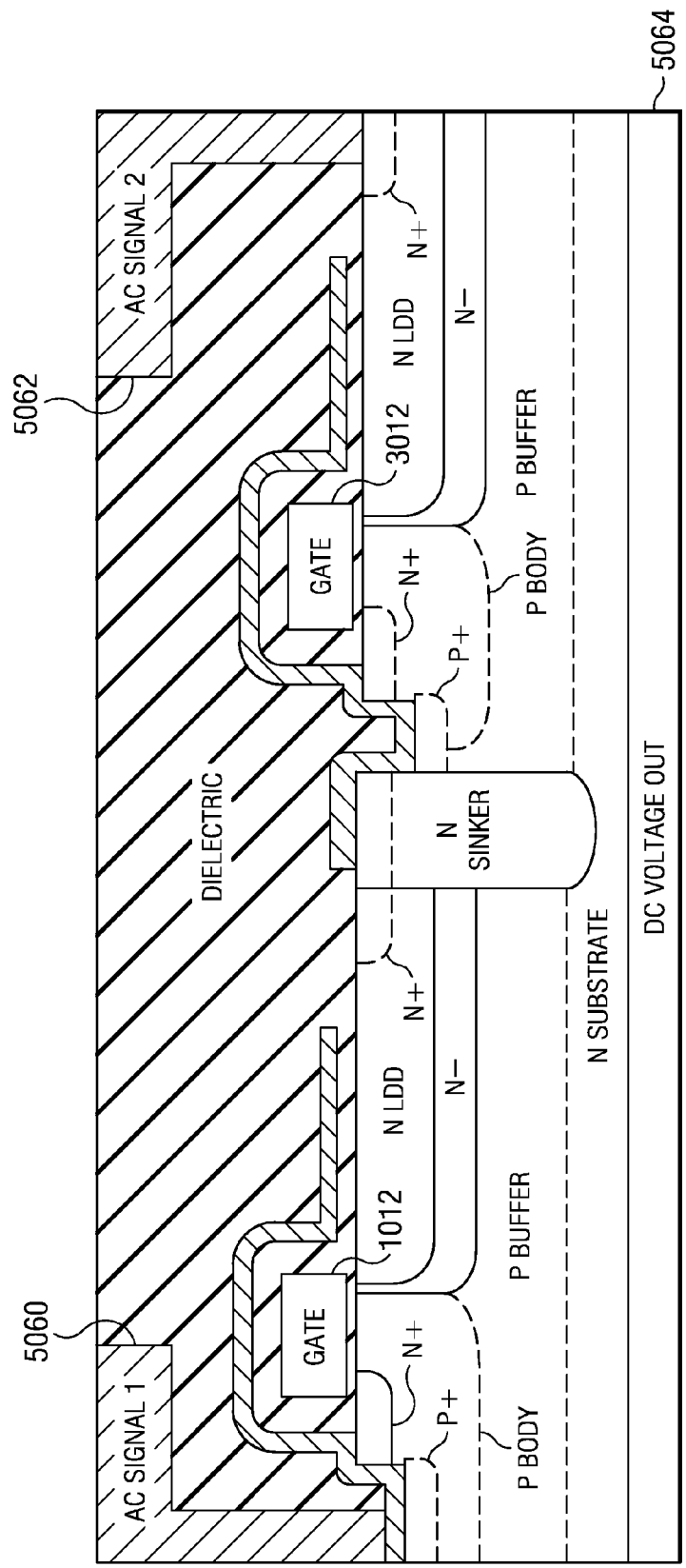

In another example embodiment the circuit in FIG. 5D may be configured as a half bridge rectifier. Terminal 1 5036 and terminal 3 5038 become AC signal, 5060 and 5062 input terminals and terminal 2 5034 becomes a DC signal 5064 output terminal. By applying AC signals, 5060 and 5062, to terminals 1, 5036, and 3, 5038, and applying a signal to turn gates 1012 and 3012 alternately on and off, a rectified DC signal 5064 is formed on terminal 2, 5034.

Figure 6:
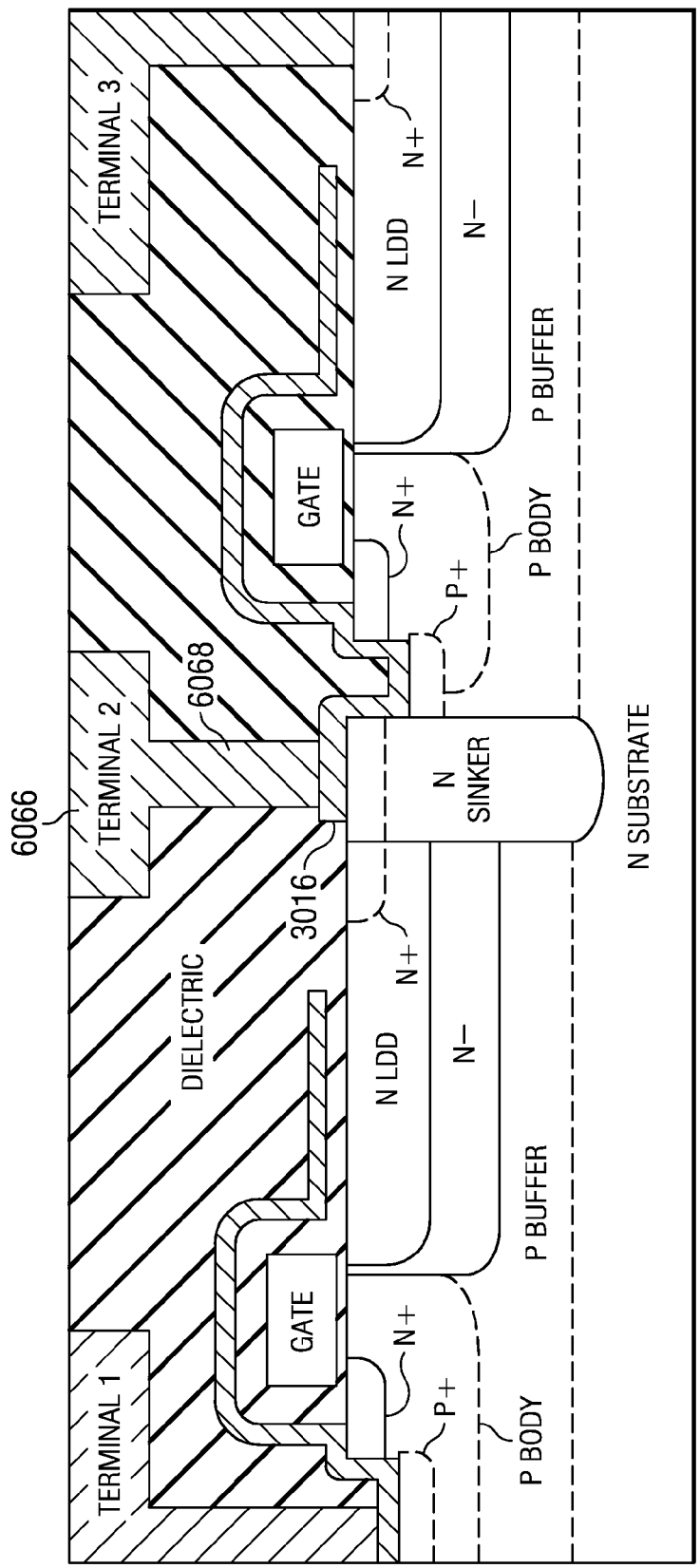
FIG. 6 A high performance, power circuit formed using two CBDENMOS transistors according to an embodiment.

If backside contact is not desirable, terminal 2, 5034, may be converted into a topside terminal 2, 6066, as shown in FIG. 6 by forming a topside contact, 6068, to the gate shield, 3016.

Other useful configurations for the embodiment circuit may be known to those skilled in the art.

Figure 2:
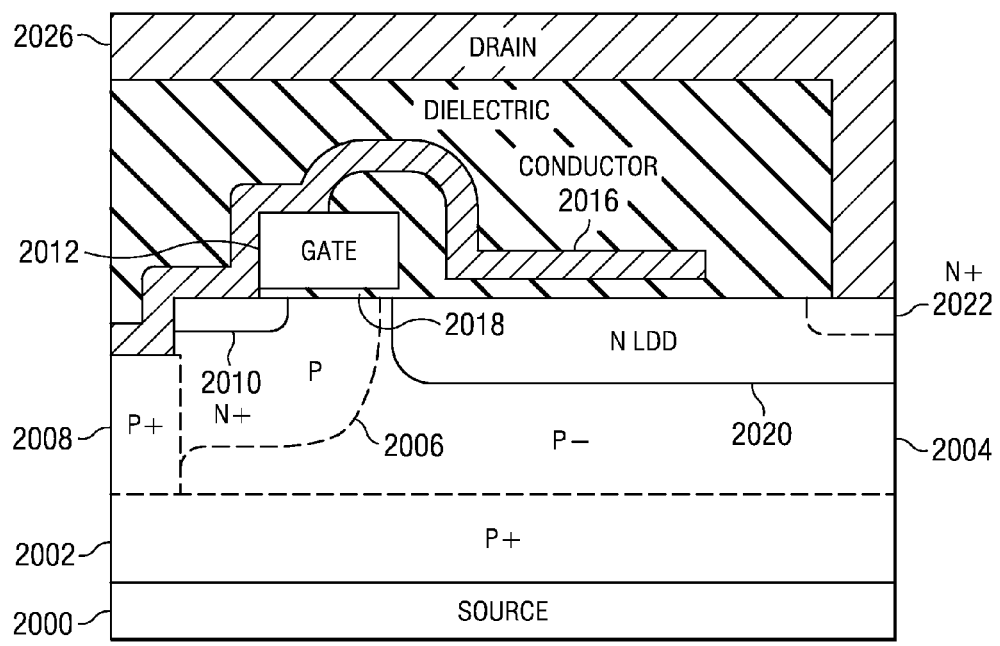
FIG. 2 A CBCD formed on p-type substrate.

A charge balanced channel diode (CBCD) as described in co-pending U.S. patent application Ser. No. 12/815,877 is shown in FIG. 2. The charge balanced extended drain enables a reduced area channel diode which improves performance and reduces manufacturing cost.

A CBCD may be formed by shorting the gate 2012 of a CBEDNMOS transistor to the source 2010. The CBCD in FIG. 2 is formed in a p-type substrate 2002 which also is the source 2000 of the CBCD. The CBCD is formed in a p-epi layer 2004. A highly doped p-sinker 2008 forms a low resistance path between the backside source contact 2000 and the channel diode source diffusion 2010. An extended drain, 2020, is formed between the gate 2012 and the drain diffusion 2022. When high voltage is applied to the drain 2026, the extended drain 2020 fully depletes dropping sufficient voltage between the drain diffusion 2022 and the gate 2012 to prevent damage to the gate oxide 2018. Gate shield, 2012, shorts the gate 2012 to the source diffusion 2010 and to p-body, 2006. The gate shield, 2016 overlies a portion of the extended drain 2020, providing a charge balanced condition which allows a higher voltage to be dropped across a shorter length drain extension, 2020. When the potential on the source 2010 begins to rise, the voltage on the gate, 2012, also begins to rise. In addition as the voltage on the transistor body, 2006, rises the turn on voltage of the transistor decreases causing a channel to form under the gate, 2012, between the source 2010, and the extended drain, 2020, before the PN junction between the source 2010 and the transistor body 2006 becomes forward biased. When the channel forms the transistor turns on and current flows through the channel diode from the source 2000 to the drain 2026. Since the turn on voltage of the channel diode is lower than the forward biasing voltage of the PN diode less power is consumed by a CBCD than a PN diode. In addition, since conduction through the CBCD channel is majority carrier only, recovery time to begin supporting reverse voltages is virtually instantaneous and significantly faster than a conventional PN diode making the CBCD particularly useful for rectifying high voltage in high frequency circuits. P-sinker diffusion, 2008, provides a low resistance path to the substrate, 2002, which is the transistor source, 2000. This type of bottom side source provides a significantly lower diode series resistance than a channel diode with a topside source and topside drain. This lower resistance source reduces power losses in especially high power applications and improves performance especially in high frequency applications.

Figure 4:
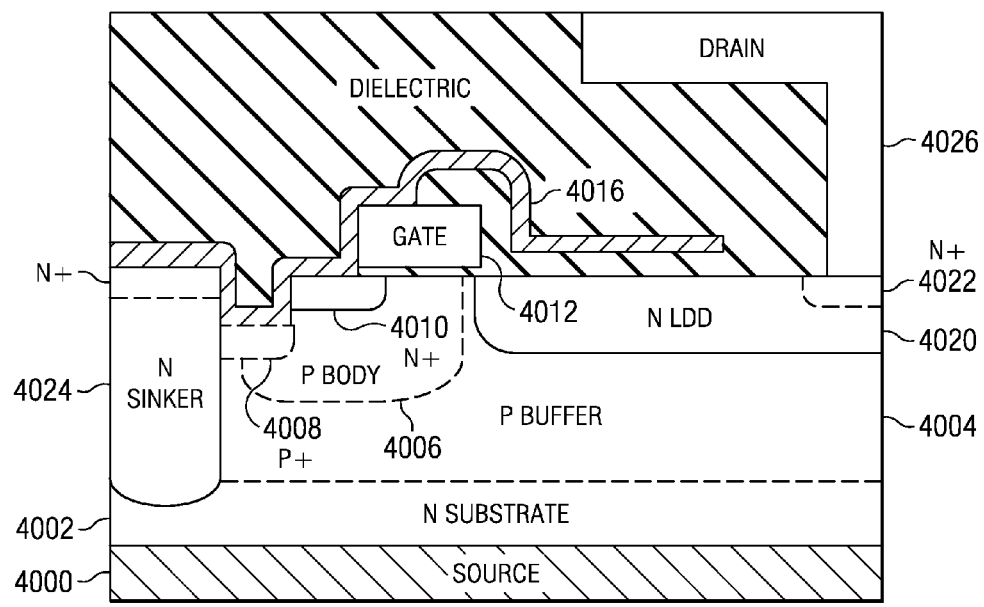
FIG. 4 A CBCD formed on n-type substrate formed according to an embodiment.

FIG. 4 shows an embodiment charge balanced channel diode (CBCD) with reduced substrate resistance. In the CBCD in FIG. 2, p-type the substrate, 2002, is connected to the source diffusion 2010 through p-sinker 2008. A p-type substrate is typically 2 to 3 times more resistive than an n-type substrate. In FIG. 4, an n-sinker, 4024 connects the CBCD source 4010, to n-type substrate, 4002. The CBCD in FIG. 2 is formed in a pwell composed of p-body 4006 and p-buffer 4004. The n-substrate 4002 source resistance of CBCD in FIG. 4 is lower than the p-substrate 2002 source resistance of the CBCD in FIG. 2. This lower resistance has the benefit of lower operating power and also superior performance especially at high frequency.

Figure 7:
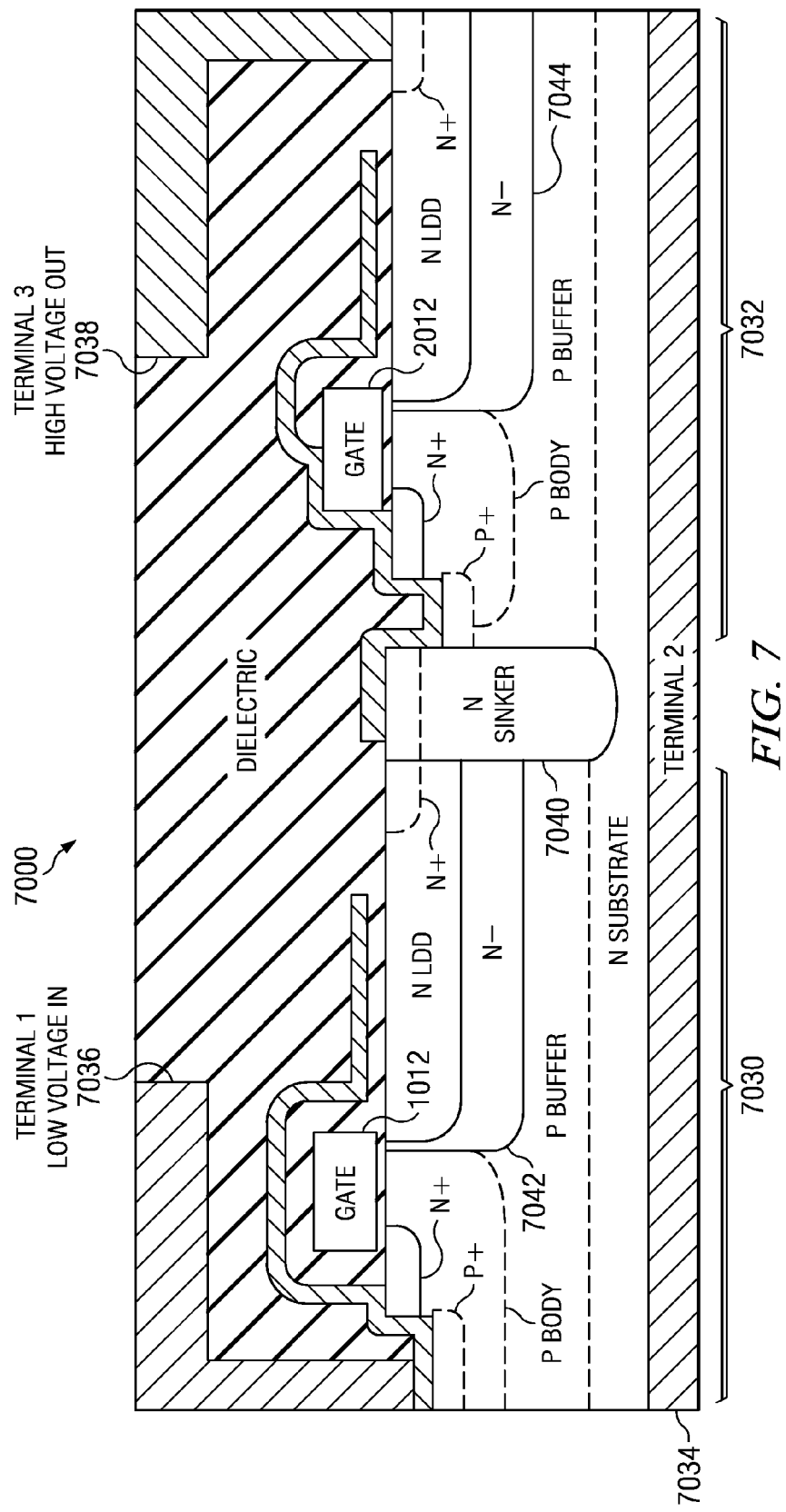
FIG. 7 A high performance, power circuit formed using one CBDENMOS transistor and one CBCD according to an embodiment.

The embodiment CBCD of FIG. 4 may be combined with the CBDENMOS shown in FIG. 1 to form the embodiment high voltage, high power circuit shown in FIG. 7. The CBDENMOS transistor on the left, 7030, is similar to the CBDENMOS transistor described in FIG. 1 and the CBCD on the right, 7032 is similar to the CBCD described in FIG. 4 except for the lightly doped N– layers, 7042 and 7044, which add additional doping gradient to the extended drain region but do not change the basic operation of the CBDENMOS or the CBCD.

This circuit may be configured as a boost converter. Terminal 1 7036 becomes a low voltage supply terminal and terminal 3 7038 becomes a high voltage output terminal. By applying a low voltage to the source terminal 7036, and applying a signal to turn the gate 1012 of the CBDENMOS transistor 7030, charge may be pumped into terminal 2, 7034 and through channel diode 2012, to provide a high output voltage on terminal 3 7038.

Figure 8:
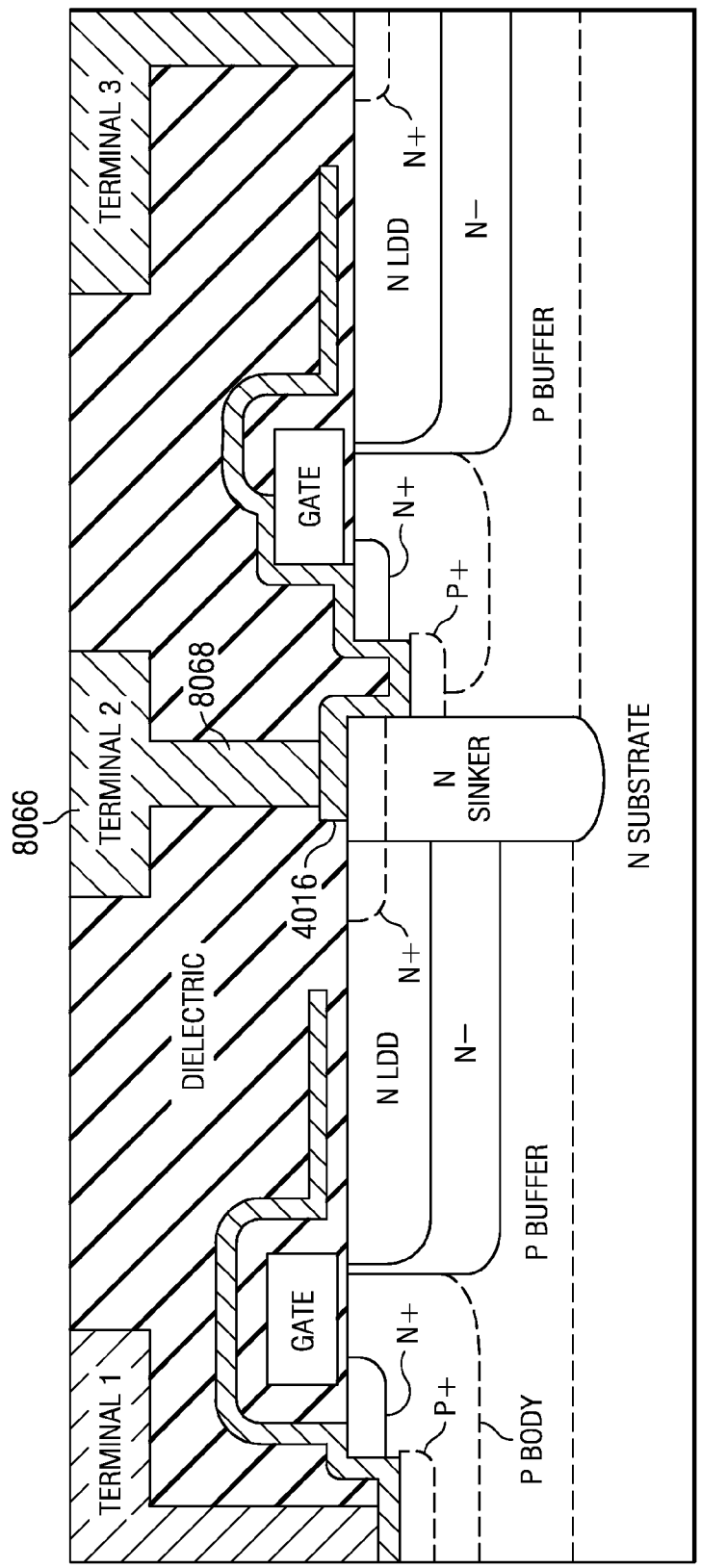
FIG. 8 A high performance, power circuit formed using one CBDENMOS transistor and one CBCD according to an embodiment.

If backside contact is not desirable, terminal 2, 7034, may be converted into a topside contact, 8066, as shown in FIG. 8 by forming a topside contact, 8068, to the gate shield, 4016.

Other useful configurations for the embodiment circuit may be known to those skilled in the art.

The major steps in a process flow that may be used to form the circuit in FIG. 6 are illustrated in the cross sections in FIGS. 9A through 9K. The circuits in FIGS. 5, 7, and 8 are formed in a similar manner.

A cross section of a partially processed integrated circuit is shown in FIG. 9A. An n-type layer, 9004 may be epitaxially grown on an n-type substrate 9000 that has been processed through shallow trench isolation (STI), and transistor turn on voltage (vt) implants. P-buffer layer, 9002, is formed by p-type dopant implantation and anneal. If core logic transistors (not shown) are also formed, the partially processed integrated circuit may also be processed through pwell and nwell implantation and anneal. A gate dielectric, 9006 is then grown or deposited followed by deposition of gate material, 9008. A gate pattern, 9005, is formed on the gate material. In an example embodiment, the n-type substrate is doped with phosphorus or arsenic with a dopant concentration greater than $1E19/cm^3$. The n-epi layer 9002 is grown to a thickness of 2 to 5 mm with a phosphorus concentration of 1E14 to $5E16/cm^3$. The p-type buffer layer 9002 is formed by implanting 1E12 to $2E13/cm^3$ boron 11 at 250 to 700 kev. The gate dielectric is a thermally grown silicon dioxide between 10 to 50 nm depending upon voltage requirements. The gate material is polysilicon or a polysilicon, tungsten silicide stack.

The gate stack, 9008, is etched to form transistor gates, 9010 and 9012, in FIG. 9B.

In FIG. 9C, the sinker photoresist pattern, 9014, is formed and the sinker diffusion, 9018 is implanted, 9016, and annealed. The sinker may be formed by a series of phosphorus implants at several energies. A low energy implant may be used to dope the sinker near the surface, a medium energy implant to dope the sinker below the surface, and a higher energy implant to counter dope the p-buffer region, 9002, forming a low resistance connection between the surface of the integrated circuit and the substrate, 9000. In an example embodiment, phosphorus is implanted with doses in the range of 5E13 to $1E15/cm^2$ and energies in the range of 200 to 800 kev. The integrated circuit is then annealed between 750 C and 900 C for 20 to 90 minutes to diffuse and activate the sinker dopant.

Although the sinker is shown to be formed using implants in this example embodiment, other means of forming the sinker may also be used. For example, a trench may first be etched down to the n-substrate, 9000, and then filled with a conductive material such as doped polysilicon or a deep contact down to the n-substrate may be formed and filled with CVD-W.

As shown in FIG. 9D, a p-body photoresist pattern 9020 is formed and boron 9022 is implanted to form transistor bodies, 9024 and 9026. In an example embodiment two implants are used to achieve a more uniform p-body doping. In an example embodiment a first implant with a boron 11 dose in the range of 1E13 to $8E13/cm^2$ is implanted at 40 kev and a second implant with a boron 11 dose in the range of 1E13 to $9E13/cm^2$ is implanted with an energy of 100 kev.

In FIG. 9E, offset sidewalls, 9035, may be formed by conformally depositing a dielectric such as silicon dioxide or silicon nitride and performing an anisotropic etch. A blanket n-extension (NLDD) implant 9028 may be used to form the source extensions, 9030 and 9034, and to add additional dopant to the drain extension regions, 9032 and 9036, as shown in FIG. 9E. The n-extension implant 9028 may be a patterned implant in core CMOS logic areas to block the n-extension implant 9028 from pmos transistor areas. In an example embodiment, 8 nm to 15 nm SiO2 is deposited and anisotropically etched to form offset sidewall spacers, 9035. The n-extension implant 9028 is a phosphorus implant with a dose in the range of 1E12 to $1E13/cm^2$ and an energy in the range between 60 and 160 kev.

Sidewalls 9045, may be formed by conformally depositing a dielectric such as silicon dioxide or silicon nitride and performing an anisotropic etch as shown in FIG. 9F. An NSD photoresist pattern, 9038, is then formed and n-type dopants are implanted, 9040, to form the source diffusions, 9042 and 9046, and the drain diffusions 9044 and 9048. In an example embodiment, SiO2 with a thickness of 40 to 150 nm is deposited and anisotropically etched to form sidewalls 9045. NSD implant 9040 is an arsenic implant with a dose in the range of 3E14 to $1E16/cm^2$ and an energy in the range of 20 to 100 kev.

In FIG. 9G a dielectric layer 9050 is deposited over the integrated circuit. A gate shield contact photoresist pattern, 9052 is formed with openings over the gate shield contact regions, 9054 and 9056. In an example embodiment SiO2 with a thickness in the range of 100 nm to 300 nm is deposited.

The dielectric layer 9050 is etched and the silicon is etched through the N+ layers, 9042 and 9046, to lower the resistance of the substrate contacts, 9060 and 9062. A p-type dopant, such as boron is implanted, 9058 to form substrate contacts, 9060 and 9062, to the p-body regions, 9024 and 9026. An anneal is then performed to activate and anneal the dopant. In an example embodiment, the silicon is etched to a depth of approximately 250 nm and boron with a dose in the range of 2E15 and $5E15/cm^2$ and energy in the range of 20 to 50 kev is implanted to form substrate contact diffusions, 9060 and 9062. The anneal may be a rapid thermal anneal with a temperature in the range of 950 to 1050 C.

The gate shield 9064 is deposited and patterned with gate shield photoresist pattern, 9066, as shown in FIG. 9I. In an example embodiment the gate shield is formed by depositing approximately 50 nm titanium plus approximately 60 nm titanium nitride and annealing it using RTA at approximately 650 C. The titanium reacts with exposed silicon in the gate shield contact regions, 9054 and 9056 to form titanium silicide which significantly lowers contact resistance.

In FIG. 9J the gate shield material 9064 is etched to form gate shields 9068 and 9070. The gate shields cover the gates, 9010 and 9012, shielding them from high voltages that may be applied to the drain diffusion, 9048, for example. This significantly reduces gate to drain capacitance improving transistor performance. In addition the gate shields partially overlie drain extensions, 9032 and 9036, providing a charge balanced condition in the drain extensions which enables the extensions to handle a higher voltage over a shorter length drain extension. This saves cost by reducing area and improves performance by reducing series resistance.

Figure 9K:
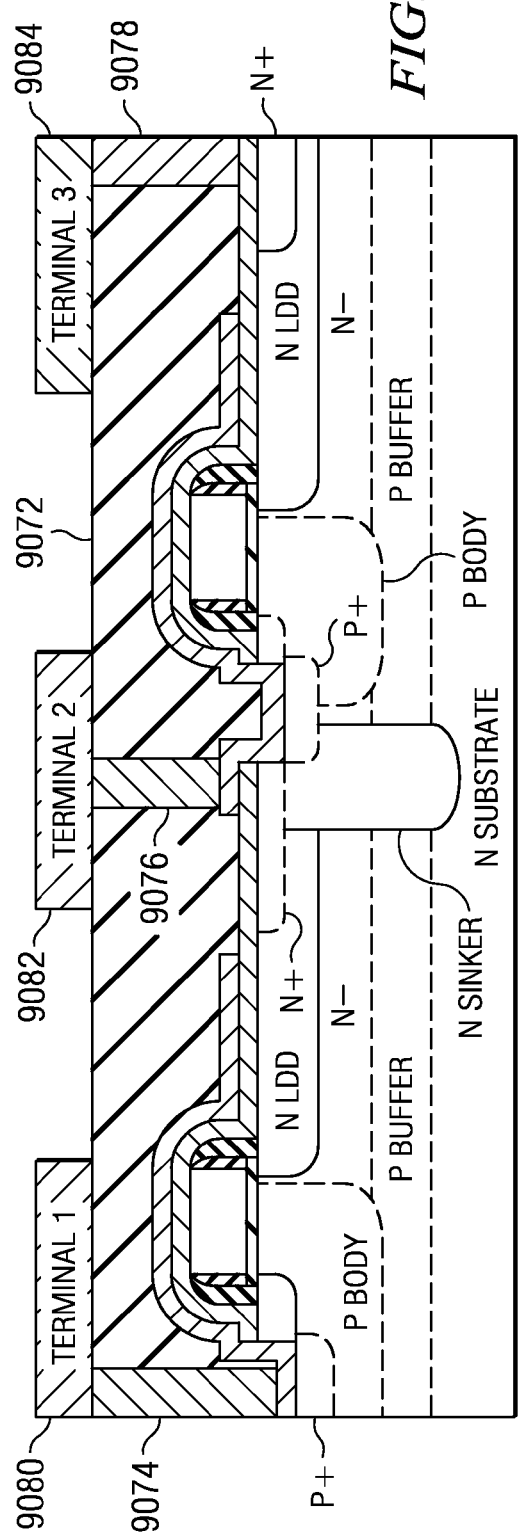

FIG. 9K shows the integrated circuit with premetal dielectric (PMD), 9072; with contacts, 9074, 9076, and 9078; and with first layer of interconnect, 9080, 9082, and 9084 formed using well known techniques. In an example embodiment, PMD is a multilayer dielectric deposition composed of a silicon nitride etch stop layer approximately 300 nm to 500 nm thick plus a phosphorus silicate glass layer (or boron-phosphorus silicate glass) with a thickness of between 1000 and 2500 nm. The surface is planarized using CMP. In the example embodiment contacts, 9074, 9076, and 9078 are lined with about 60 nm titanium plus 40 nm TiN and filled with CVD-W plugs. The interconnect layer in an example embodiment is a stack composed of approximately 60 nm Ti, 40 nm TiN, 3000 nm Al (0.5% Cu), and 35 nm TiN.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   an n-substrate;
   a first charge balanced, drain extended, NMOS (CBDENMOS) transistor with a first terminal connected to a first source diffusion and a first extended drain shorted to said n-substrate with an n-sinker which extends through a p-buffer layer;
   a second terminal coupled to said n-sinker; and
   a second CBDENMOS transistor with a second source diffusion shorted to said n-substrate through said n-sinker and a second extended drain connected to a third terminal.

2. The integrated circuit of claim 1 where said integrated circuit is a boost circuit and where said first terminal is a low voltage power supply terminal, and were said third terminal is a high voltage output terminal.

3. The integrated circuit of claim 1 where said integrated circuit is a buck circuit and where said first terminal is a ground terminal, said second terminal is coupled to an inductor, and where said third terminal is a high voltage power supply terminal and where said second terminal is a low voltage output terminal.

4. The integrated circuit of claim 1 where said integrated circuit is a half-bridge rectifying circuit and where said first terminal is a first AC signal input terminal, said third terminal is a second AC signal input terminal and said second terminal is a DC output terminal.

5. The integrated circuit of claim 1 where a gate of said second CBDENMOS transistor is shorted to said second source to form a charge balanced channel diode and where said first terminal is a low voltage power supply terminal and where said third terminal is a high voltage output terminal.

6. The integrated circuit of claim 1 where said second terminal is a backside terminal coupled to said n-sinker through said n-substrate.

7. The integrated circuit of claim 1 where said second terminal is a topside terminal coupled to said n-sinker through a topside contact and through a gate shield of said second CBDENMOS transistor.

8. An integrated circuit, comprising:
   an n-substrate;
   a charge balanced, drain extended NMOS transistor (CBDENMOS) transistor with a first terminal connected to a source diffusion shorted to said n-substrate through an n-sinker which extends through a p-buffer layer;
   a second terminal coupled to said n-sinker, and
   a third terminal coupled to an extended drain of said CBDENMOS transistor.

9. The integrated circuit of claim 8 where a gate shield of said CBDENMOS transistor is shorted to a gate of said CBDENMOS transistor to form a charge balanced channel diode.

10. A process of forming an integrated circuit, comprising the steps:
    growing an n-epi layer on an n-type substrate;
    forming a p-buffer layer in a lower portion of said n-epi layer;
    forming a first transistor gate and a second transistor gate;
    forming an n-sinker in between said first and said second transistor gates;
    forming a first p-type transistor body under said first transistor gate and a second p-type transistor body under said second transistor gate;
    forming a first source region on a side of said first transistor gate opposite said n-sinker and a second source region between said n-sinker and said second transistor gate;
    forming a first extended drain region between said first transistor gate and said n-sinker and forming a second extended drain region on a side of said second transistor gate opposite said sinker region;
    forming a first gate shield connected to said first source region, wherein said first gate shield overlies said first transistor gate and partially overlies said first extended drain region;
    forming a second gate shield connected to said second source region and connected to said n-sinker, wherein said second gate shield overlies said second transistor gate and partially overlies said second extended drain region and wherein said second source is coupled through said n-sinker to said n-type substrate;
    forming a first terminal coupled to said first shield contact;
    forming a second terminal coupled to said n-sinker; and
    forming a third terminal coupled to said second extended drain region.

11. A process of forming an integrated circuit, comprising the steps:
    growing an n-epi layer on an n-substrate;
    forming a p-buffer layer in a lower portion of said n-epi layer;

forming a first p-type transistor body;

forming a first transistor gate partially overlying said first p-type transistor body;

forming a n-sinker through said p-type transistor body on a first side of said first transistor gate;

forming a first source region over said n-sinker and self aligned to said first transistor gate;

forming a first extended drain region self aligned to said first transistor gate on a second side of said first transistor gate;

forming a first gate shield connected to said first source region, where said gate shield overlies said first transistor gate and partially overlies said first extended drain region.

12. The process of claim 11 further comprising connecting said first gate shield to said first transistor gate.

13. The integrated circuit of claim 11, further comprising the steps of:

forming a second p-type transistor body;

forming a second transistor gate partially overlying said second p-type transistor body;

forming a second source region self aligned to a first side of said second transistor gate opposite said n-sinker;

forming a second extended drain region self aligned to a second side of said second transistor gate and connected to said n-sinker and to said first source region;

forming a second gate shield connected to said second source region, wherein said second gate shield overlies said second transistor gate and partially overlies said second extended drain region;

forming a first terminal coupled to said second gate shield;

forming a second terminal coupled to said n-sinker; and forming a third terminal coupled to said first extended drain region.

14. The process of claim 13 further comprising connecting said first gate shield to said first transistor gate where said first terminal is a low voltage power supply terminal and were said third terminal is a high voltage output terminal.

15. The process of claim 13 further comprising;

forming an inductor in an interconnect layer; and coupling said inductor to said second terminal, wherein the third terminal is a high voltage power supply terminal, said first terminal is a ground terminal, and said second terminal is a low voltage output terminal.

16. The process of claim 13 wherein said first terminal is a low voltage power supply terminal and said third terminal is a high voltage output terminal.

17. The process of claim 13 wherein said first terminal is a first AC signal input terminal, said second terminal is a DC output terminal, and said third terminal is a second AC signal input terminal further comprising;

connecting said first transistor gate and said second transistor gate to circuitry designed to turn said first transistor gate on when said second transistor gate is turned off and to turn said first transistor gate off when said second transistor gate is turned on.

18. The process of claim 13 wherein said step of forming a second terminal comprises the steps of:

forming a topside contact; and forming a topside second terminal where said topside second terminal is coupled to said n-sinker through said topside contact.

19. The process of claim 13 wherein said second terminal is a backside second terminal coupled to said n-sinker through said n-substrate and said n-sinker.

* * * * *